United States Patent [19]

Shirasaki et al.

[11] Patent Number: 4,806,442
[45] Date of Patent: Feb. 21, 1989

[54] SPATIAL PHASE MODULATING MASKS AND PRODUCTION PROCESSES THEREOF, AND PROCESSES FOR THE FORMATION OF PHASE-SHIFTED DIFFRACTION GRATINGS

[75] Inventors: Masataka Shirasaki; Hirochika Nakajima, both of Kawasaki, Japan

[73] Assignee: Fujitsu Limited, Kawasaki, Japan

[21] Appl. No.: 841,801

[22] Filed: Mar. 20, 1986

[30] Foreign Application Priority Data

Mar. 20, 1985 [JP] Japan .................................. 60-057455
Jul. 17, 1985 [JP] Japan .................................. 60-158743
Jul. 17, 1985 [JP] Japan .................................. 60-158744
Jul. 17, 1985 [JP] Japan .................................. 60-158745
Jul. 17, 1985 [JP] Japan .................................. 60-158746

[51] Int. Cl.$^4$ .............................................. G03F 9/00
[52] U.S. Cl. ........................................ 430/4; 430/321; 430/323; 430/324; 350/320; 350/162.17
[58] Field of Search ...................... 430/4, 5, 323, 324, 430/321, 329, 1, 2; 350/3.68, 3.72, 3.73, 320, 162.17, 162.14; 372/48, 96, 102

[56] References Cited

U.S. PATENT DOCUMENTS

| | | | |
|---|---|---|---|
| 3,940,274 | 2/1976 | MacAnally | 430/5 |
| 4,068,260 | 1/1978 | Ohneda et al. | 358/44 |
| 4,155,627 | 5/1979 | Gale et al. | 350/162 R |
| 4,360,586 | 11/1982 | Flanders et al. | 430/321 |

FOREIGN PATENT DOCUMENTS 0188919 7/1986 European Pat. Off. ............ 430/321

Primary Examiner—José G. Dees
Attorney, Agent, or Firm—Staas & Halsey

[57] ABSTRACT

Spatial phase modulating transparent masks comprising two or more portions having two different optical paths and their production processes are disclosed. The transparent masks are particularly useful as an exposure mask in the production of phase-shifted, distributed feedback (DFB) semiconductor lasers for a single-mode operation. A process for the formation of phase-shifted diffraction gratings or corrugations which comprises exposing a substrate, through the above transparent mask, to exposure radiation is also disclosed. According to the present invention, the phase-shifted diffraction gratings can be easily and directly produced with a high accuracy and reliability.

25 Claims, 15 Drawing Sheets

Fig. 1
PRIOR ART
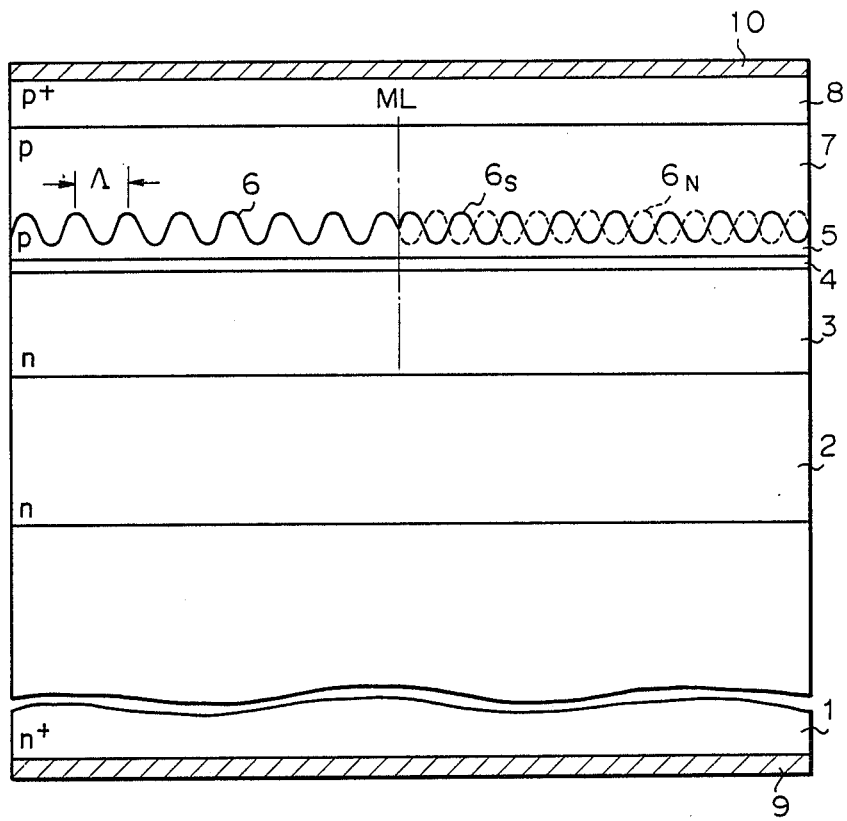
Fig. 2A
Fig. 2B
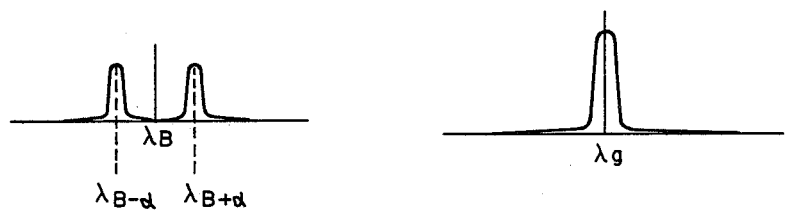

THICKNESS OF PHOTORESIST LAYER, Å

THICKNESS OF PHOTORESIST LAYER, Å

SPATIAL PHASE MODULATING MASKS AND PRODUCTION PROCESSES THEREOF, AND PROCESSES FOR THE FORMATION OF PHASE-SHIFTED DIFFRACTION GRATINGS

BACKGROUND OF THE INVENTION

1. Field of the Invention

The present invention relates to spatial phase modulating masks which are particularly useful as an exposure mask in the production of phase-shifted diffraction gratings of distributed feedback (DFB) semiconductor lasers. The present invention also relates to a process for the production of such spatial phase modulating masks and a process for the formation of phase-shifted diffraction gratings using such masks. The resulting single longitudinal mode for the DFB lasers is very important in the field of optical communication, since it can prevent a distortion of the waveform due to wavelength dispersion, can reduce noise, and can increase the utility thereof in applied optical instrumentation.

2. Description of the Related Art

Considerable development work is underway in general on semiconductor lasers with oscillation wavelengths of 1.5 to 1.6 micrometers due to the minimal loss of light of that wavelength band in transmission over optical fibers.

If a semiconductor laser of this conventional type, i.e., a Fabry-Perot (FP) semiconductor laser, is used for a high speed modulation, it cannot maintain the wavelength monochromatically and numerous wavelengths result.

If such a signal light is introduced into and transmitted through an optical fiber, the light output therefrom results in a degradation of the waveform because the refractive indexes, and thus the propagation speeds, for respective wavelengths are different due to the differences in dispersion in the material of the optical fiber itself.

Such a signal, therefore, is received at the receiving side with a great amount of noise, and so is not practical for use.

In recent years, therefore, development has been underway on DFB semiconductor lasers and good results have been obtained.

A DFB type semiconductor laser, formed on the active layer itself or layer adjacent thereto, has a diffraction grating known as a "corrugation" or just a "grating", and light travels back and forth and resonates in the active layer under the influence of this diffraction grating.

In such a DFB semiconductor laser, theoretically, it is considered possible to maintain a monochromatic wavelength oscillation even when modulating at a high speed of several hundred Mbits/sec. In practice, however, this is very difficult.

This is because the corrugations in the afore-mentioned DFB laser are formed uniformly and, therefore, the corrugations have a uniform structure without discontinuity. In other words, a so-called symmetric DFB semiconductor laser is formed in which, since the losses in the two longitudinal modes symmetrically occurring on the two sides of the side center are equal, dual-mode oscillation can take place or oscillation can transfer between two resonance modes differing by just plus or minus the same wavelength from the Bragg wavelength corresponding to the period of the corrugations, resulting in unstable oscillation.

Therefore, a so-called $\Lambda/2$-shifted DFB semiconductor laser ($\Lambda$=corrugation period) has been developed to eliminate this problem. A conventional $\Lambda/2$-shifted DFB type semiconductor laser has a structure in which, seen from the side center, the corrugation of the right side section or the left side section is shifted by just $\Lambda/2$. The $\Lambda/2$-shifted DFB semiconductor laser can oscillate with a single mode at the Bragg wavelength. The oscillation characteristics of the $\Lambda/2$-shifted DFB semiconductor laser are extremely superior.

There are, however, considerable problems in the manufacture of the $\Lambda/2$-shifted DFB semiconductor laser. Specifically, the period $\Lambda$ of the corrugation itself is as small as 0.3 to 0.4 micrometers, for example. Therefore, it is very difficult to manufacture the right and left two corrugations as being shifted by exactly $\Lambda/2$ and being combined at the middle of the DFB laser without discontinuity of the corrugations.

Recently, several improved methods have been proposed to realize satisfactory quarter-wave ($\lambda/4$)-shifted or similar phase-shifted DFB semiconductor lasers. One such method is to fabricate phase-shifted corrugations using electron-beam lightography. K. Sekaptedjo, et al reported in their *Electronics Letters,* Jan. 19, 1984, Vol. 20, No. 2, pp. 80–81 that:

"We fabricated phase-shifted DFB lasers. The second-order corrugation was formed on the InP substrate using an electron-beam exposure system with a precise pitch controller, where at the centre the phase of the corrugation was shifted by $\Lambda/4$, corresponding to a shift of $\pi$ in the first-order space-harmonics. The corrugation was transcribed into InP substrate by etching with $HBr+HNO_3+10\ H_2O$. The liquid-phase epitaxy was carried out to grow the n-GaInAsP ($\lambda_g=1.35$ $\mu$m) buffer, undoped GaInAsP ($\lambda_g=1.55$ $\mu$m) active, p-InP cladding and p-GaInAsP cap layers successively, where a GaAs cover was used to preserve the corrugated surface from thermal deformation. Lasers with 30 $\mu$m oxide stripes were cut with sawed sides, and the cavity was formed by sawing at one end to suppress the Fabry-Perot modes and cleaving the other end to provide the output facet, so that the point of the phase shift is at the centre of the cavity." The use of electron-beam lithography in the phase-shifted corrugations suffers from some drawbacks. For example, it requires complicated and troublesome operations, and takes a large amount of production time. In addition, it is not suitable for a mass production of the corrugations.

Another improved method is to fabricate $\lambda/4$-shifted InGaAsP/InP DFB lasers by simultaneous holographic exposure of positive and negative photoresists. K. Utaka, et al reported in their *Electronics Letters,* Nov. 22, 1984, Vol. 20, No. 24, pp. 1008–1009 that:

"First, a negative photoresist (OMR) with a thickness of about 700 Å and a positive photoresist (MP) were spin-coated successively on an n-InP substrate. Parts of the upper positive photoresist were removed by the conventional photolithography and the negative photoresist in the disclosed area was etched off by using sulphuric acid. Second, after removing the remaining positive photoresists, ~700 Å-thick positive photoresist was newly coated on a whole surface. Consequently, some parts of the substrate were covered with positive photoresist and the other parts with negative and positive photoresists. These separately deposited photoresists were simultaneously exposed by the holographic exposure using 3250 Å He-Cd laser. After the developments and the transcriptions carried out separately for each photoresist, λ/4-shifted corrugations were formed."

It should be noted that the combined use of positive and negative photoresist is a good idea, but, in the practice of this method, it is difficult to find specific photoresists, particularly negative photoresists, having a high resolving power. Further, steps in a separate coating and simultaneous patterning of the positive and negative photoresists are complicated and troublesome.

SUMMARY OF THE INVENTION

An object of the present invention is to provide a simple and easy process for the formation of phase shifted diffraction gratings or corrugations which are particularly useful in the DFB semiconductor lasers. The resulting diffraction gratings are exactly phase-shifted, and the formation process is carried out with reliability.

Another object of the present invention is to provide a spatial phase modulating contact mask for use in phase-shifting the diffraction gratings, which mask has a simple structure and, therefore, is easily produced with a high accuracy.

Still another object of the present invention is to provide a process of the production of the above-described contact masks with a high accuracy and reliability.

The first object of the present invention is attained, according to the present invention, by providing a spatial phase modulating mask which consists of a material transparent to radiation used in an exposure step in the formation of diffraction gratings and comprises two or more portions having two different optical paths.

In an aspect of the present invention, the exposure mask of the present invention may be in the form of a plate having two or more rectangular parallelopiped-shaped recesses selectively formed on a major surface thereof. In other words, it may be a transparent plate having stripe-shaped recesses and projections alternately formed thereon.

In this and other masks of the present invention, two unsymmetrical fluxes of radiation are irradiated on a mask surface, a central axis of the fluxes being relatively inclined with respect to a normal line of the mask surface.

In another aspect of the present invention, the exposure mask may be provided with a light-screening layer, preferably a layer of metal such as nichrome or the like which acts as a barrier to the exposure radiation. Preferably, the light-screening layer is disposed in each of the two edge areas of the bottom of the recesses. The light-screening layer is entirely or partially embedded in the mask.

In still another aspect, the exposure mask may have an antireflection layer or so-called "AR coat" coated on both major surfaces thereof.

In yet another aspect, the exposure mask of the present invention may be in the form of a plate having selectively formed on a major surface thereof two or more rectangular parallelopiped-shaped projections which consist of a material transparent to radiation used in an exposure step in the formation of diffraction gratings. The material of the projections may be the same as or different to that of the plate.

As a modification of this structure, each of the rectangular parallelopiped-shaped spaces between the two adjacent projections may be occupied with a material which is transparent to radiation used in an exposure step in the formation of diffraction gratings, but has a refractive index different from that of the projections.

Further, as described above, the just-described exposure masks of the present invention may be provided with a light-screening layer and/or an antireflection layer.

Also, in an aspect of the present invention, the exposure mask may be in the form of a plate, a major surface of which has phase-shifted diffraction gratings formed thereon. The diffraction gratings of this mask can produce diffracted and transmitted lights having the same emission angle and intensity, after an incident exposure radiation is passed through the same. Preferably, they have a phase shifted by an amount of a half of their period. Both major surfaces of the mask are preferably provided with an antireflection layer discussed above.

In another aspect of the present invention, the exposure mask may be in the form of a triangular prism having two or more rectangular parallelopiped-shaped recesses selectively formed on a major surface thereof. Preferably, all of the three major surfaces of the prism have an anti-halation layer, discussed above, coated on each of the surfaces.

According to the present invention, the second object of the present invention is attained by providing a process for the production of a spatial phase modulating mask comprising a substrate having two or more projections and recesses alternately formed on a surface thereof, which process comprises the steps of:

forming on a surface of the substrate a first masking layer, the pattern of which corresponds to a pattern of the recess to be formed on the substrate;

coating the first masking layer and the uncoated surface of the substrate with a projections-forming material;

forming on a coating of the projections-forming material a second masking layer, the pattern of which corresponds to a pattern of the projections to be formed on the substrate;

etching the unmasked coating of the projections-forming material until the underlying first masking layer is just exposed; and removing the first and second masking layers.

In the formation of the second masking layer, it is preferred that a photoresist pattern which corresponds to a pattern of the recesses to be formed on the substrate is previously formed on the coating of the projections-forming material using a self-alignment method wherein a patterning exposure is carried out from the back side of the transparent substrate through the same and the transparent coating of the projections-forming material, and the photoresist pattern is removed during the formation of the second masking layer.

Further, it is also preferred that both of the substrate and the projections-forming material are silicon dioxide ($SiO_2$), and that the unmasked coating of silicon dioxide as the projections-forming material is etched off by using an ion beam etching in a mixed gas of $CF_4$ and $O_2$, while the first and second masking layers are aluminum.

In an aspect of the present invention, the production process of the exposure mask may comprise the further step of filling the recesses formed on the substrate with a material having a refractive index different from that of the projections also formed on the substrate.

In another aspect of the present invention, the production process of the exposure mask may comprise the further step of coating both surfaces of the substrate, i.e., a shaped surface (projections- and recesses-containing surface) and an opposite surface thereto, with an antireflection layer.

In still another aspect of the present invention, the substrate used in the production of the mask may have a light-screening layer disposed on its surface in an interfacial area between the two adjacent projection and recess to be formed.

According to the present invention, the third object of the present invention is attained by providing a process for the formation of phase-shifted diffraction gratings, which process comprises the step of exposing a surface of the substrate on which diffraction gratings are fabricated, through a spatial phase modulating mask which consists of a material transparent to radiation used in an exposure step in the formation of diffraction gratings and comprises two or more portions having two different optical paths, and a shaped surface of which mask is opposed to and in contact with the surface of the substrate, to the exposure radiation.

The spatial phase modulating masks which can be advantageously used in the practice of the present process were generally described in the above paragraphs and will be described in detail hereinafter.

In an aspect of the present invention, the exposure radiations used for patterning of the diffraction gratings may comprise two nonsymmetrical fluxes of radiation, a central axis of the fluxes being relatively inclined with respect to a normal line of the surface of the mask on which the radiation is irradiated.

In another aspect of the present invention, the exposure radiations may comprise unidirectional fluxes of radiation, and the shaped surface of the mask may have phase-shifted diffraction gratings, while its opposite surface is flat.

In any case, it is generally preferred that a pattern of the interference fringes formed in a layer of photoresist on the substrate as a result of patterning exposure is transferred to the underlying substrate through etching.

In another aspect of the present invention, a layer thickness of the photoresist on the substrate may be selected depending on a wavelength of the exposure radiation, the type of polarized light, an angle of incidence of the light, and a refractive index of the substrate so that the lowest reflectance is obtained.

In the practice of this formation process, the substrate used is preferably a semiconductor material having a refractive index of 2.5 to 3.5, more preferably InP, for example. Preferably, a S-polarized light is introduced into a layer of the photoresist such as AZ-1350J (trade name of Azoplate-Shipley, U.S.) at an incident angle of 30° to 70°. Further, preferably, the exposure radiation used is an ultraviolet radiation and the layer thickness of the photoresist is selected from the range of thickness which results in the reflectance of the second minimum.

BRIEF DESCRIPTION OF THE DRAWINGS

The above objects and the features of the present invention will be more apparent from the following description of the preferred embodiments with reference to the drawings, wherein:

FIG. 1 is a cross-sectional view of a main portion of a conventional DFB semiconductor laser;

FIG. 2A is a graph explaining an undesired double-mode oscillation in the laser shown in FIG. 1;

FIG. 2B is a graph explaining a desired single mode oscillation in the laser shown in FIG. 1;

DESCRIPTION OF THE PREFERRED EMBODIMENTS

Figure 3A:
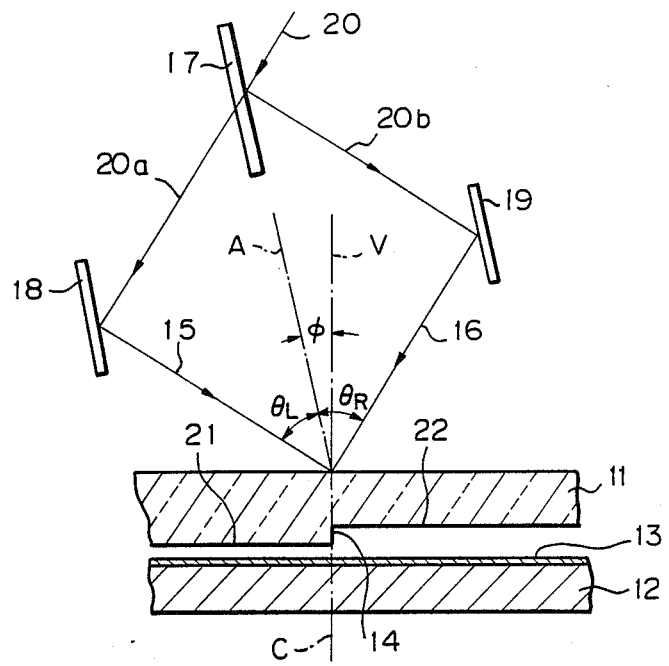
FIG. 3A is a cross-sectional view illustrating a basic principle of the process for the formation of diffraction gratings according to the present invention.

Before describing the embodiments of the present invention, a conventional $\Lambda/2$-shifted DFB semiconductor laser is described with reference to FIGS. 1, 2A and 2B.

FIG. 1 is a cross-sectional view of a main portion of a conventional $\Lambda/2$-shifted DFB semiconductor laser. In FIG. 1, 1 is an n+-type InP substrate, 2 an n-type InP buffer layer, 3 an n-type InP clad layer, 4 a nondoped InGaAsP active layer for conducting light of an oscillating wavelength $\lambda g$ equal to 1.3 μm, 5 a p-type InGaAsP optical guide layer for conducting light of an oscillating wavelength $\lambda g$ equal to 1.2 μm, 6 diffraction gratings or corrugations, 6s a phase-shifted corrugation, $6_N$ a non-shifted corrugation, 7 a p-type InP clad layer, 8 a p+-type InGaAsP contact layer, 9 an n side electrode, and 10 a p side electrode.

Before the $\Lambda/2$-shifted DFB semiconductor laser was developed, the non-shifted corrugation $6_N$ as illustrated by a block curve was employed. The corrugation $6_N$ is not shifted with respect to the corrugation 6 on the illustrated left side section from the middle line ML. Because of this structure, the non-shifted DFB laser has a disadvantage of unstable oscillation as previously mentioned. That is, as illustrated in FIG. 2A, the non-shifted DFB laser theoretically oscillates at dual-mode oscillation at two frequencies $\lambda \beta \pm \alpha$, where $\lambda \beta$ is the Bragg frequency and $\alpha$ is a constant. In practice, due to a slight difference in physical characteristics of the corrugation 6 on the left side section and the non-shifted corrugation $6_N$ on the right side section, the oscillation can transfer between the two resonance modes of the wavelengths $\lambda g \pm \alpha$.

In the conventional $\Lambda/2$-shifted DFB semiconductor laser, the corrugation 6s on the right side section has a phase which is shifted by exactly $\Lambda/2$ from the phase of the corrugation 6 on the left side section with respect to the middle line ML. The notation "$\Lambda$" represents the period of the corrugation 6. The illustrated $\Lambda/2$-shifted DFB semiconductor laser oscillates at a primary mode in which the length of two periods $2\Lambda$ of the corrugation 6 is equal to one wavelength $\lambda$ of light generated therein. In the primary mode, the shift of the corrugation by exactly $\Lambda/2$ results in a shift of the light phase by $\lambda/4$.

A $\Lambda/4$-shifted DFB semiconductor laser (not shown) oscillates at a secondary mode in which the length of one period $\Lambda$ of corrugation is equal to one wavelength $\lambda$ of light generated therein. In the secondary mode, the shift of the corrugation by exactly $\Lambda/4$ results in the same shift of the light phase as $\Lambda/4$.

If the corrugation 6s on the right side can be manufactured to be shifted exactly $\Lambda/2$ and combined to the corrugation 6 at the left side section without discontinuity, the above-mentioned disadvantage in the conventional non-shifted DFB laser would disappear so that the conventional $\Lambda/2$-shifted DFB semiconductor laser would provide superior oscillation characteristics of a single-mode oscillation as illustrated in FIG. 2B.

However, since the period $\Lambda$ of the corrugation 6 or $6_N$ is as small as 0.3 to 0.4 μm, as described before, it is very difficult to manufacture the right corrugation 6s and left corrugation being shifted by exactly $\Lambda/2$ and being combined at the middle line ML without discontinuity of the corrugations.

Now, embodiments of the present invention will be described. Throughout the description and drawings, the same portions are represented by the same reference symbols.

Figure 3B:
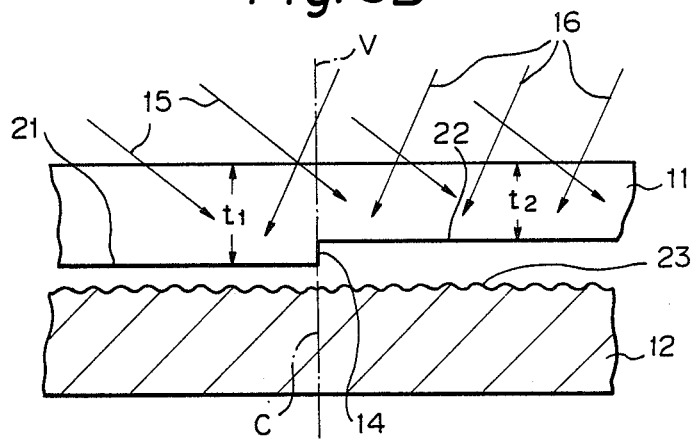
FIG. 3B is a partially enlarged view of the basic principle illustrated in FIG. 3A.

Referring now to FIGS. 3A and 3B, a basic principle of the process for the formation of diffraction gratings or corrugations according to the present invention is schematically illustrated. FIG. 3A is a cross-sectional view of the whole part of the device for carrying out the present process, and FIG. 3B is an enlarged cross-sectional view of the main part of the device of FIG. 3A except that, in FIG. 3B, phase-shifted diffraction gratings have been already fabricated on a surface of the substrate.

A substrate 12 having coated thereon a photoresist layer 13 is a medium on a major surface of which phase-shifted diffraction gratings are fabricated. First, a pattern of the intended gratings is formed in the photoresist layer 13, and the pattern of the gratings is then transferred to the underlying substrate 12. An exposure mask 11 a stepped surface of which is opposite to the photoresist layer 13 of the substrate 12 comprises a transparent material such as glass. The mask 11, as is illustrated, has a step 14 in line with an oscillation center C, thereby having two different optical paths. An optical path of the left side section or projected area 21 is longer than that of the right side section or recessed area 22. In place of the illustrated structure, the mask 11 may have a composite structure of the right and left halves which possess different refractive indexes, in order to provide two different optical paths.

In the formation of the phase-shifted diffraction gratings, two nonsymmetrical radiation fluxes 15 and 16 are irradiated on the photoresist layer 13 of the substrate 12 through the exposure mask 11. An incident angle of the radiation fluxes 15 and 16 is $\theta_L$ plus $\theta_R$ and a central axis A of the fluxes 15 and 16 is relatively inclined with respect to a normal line V of the flat surface of the mask 11 (In the illustrated instance, an angle of inclination is represented by "$\phi$"). After irradiation of the fluxes 15 and 16, these fluxes are interfered in the photoresist layer 13, thereby resulting in a pattern of the interference fringes (not shown) therein.

Two fluxes 15 and 16 of radiation used as the exposure radiations are produced as is illustrated in FIG. 3A. A single laser beam 20 is irradiated on a half-mirror 17, and then the laser beam 20a transmitted the half-mirror 17 is reflected on a surface of mirror 18 upon irradiation thereon. A first fluxes 15 of radiation are thus produced. A second fluxes 16 of radiation are produced after a laser beam 20b reflected on the half-mirror 17 were again reflected on a mirror 19.

As is apparent from FIG. 3B, a thickness of the exposure mask 11 is reduced from $t_1$ (left section) to $t_2$ (right section) at a position of the step 14 or the oscillation center C. This means that the exposure mask 11 has two different optical paths, i.e., longer optical path in the left side section 21 bisected by the oscillation center C and shorter optical path in the remaining right side section 22. Due to this fact, and since two nonsymmetrical fluxes 15 and 16 of radiation are irradiated on the exposure mask 11, a pattern of phase-shifted interference fringes is produced in the resist layer (not shown). Thereafter, the resist pattern of the phase-shifted interference fringes which corresponds to a desired pattern of the phase-shifted diffraction gratings is transferred to the substrate 12 by a conventional transfer process such as etching to form diffraction gratings 23 having a phase shift at the position of the oscillation center C.

Figure 4:
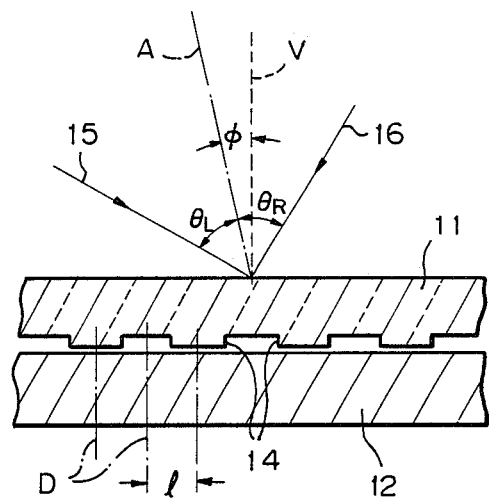
FIG. 4 is a cross-sectional view illustrating an example of the process for the formation of the diffraction gratings according to the present invention.

A practical formation of the phase-shifted diffraction gratings according to a preferred embodiment of the present invention will be more appreciated by referring to FIG. 4 which is included herein to explain a concurrent production of a plurality of phase-shifted DFB lasers. A transparent mask 11, as is illustrated, has a plurality of projections with steps 14, and the projections are disposed in an interval or pitch l which length is the same as a size or cavity length of the desired DFB laser. Upon exposure to the exposure radiations 15 and 16 and subsequent processings, the substrate 12 having formed thereon diffraction gratings which have periodic phase-shifts, is produced (not shown). Positions of the resulting phase-shifts are in line with both steps 14 of each projection. Finally, the substrate with phase-shifted gratings are cut off at a cutting line D. Each of cut pieces of the substrate has a phase-shift in a center of its corrugation.

Figure 5:
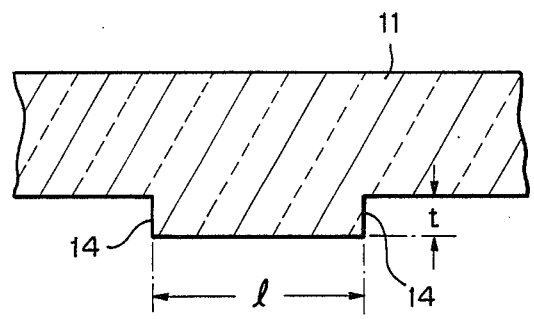
FIG. 5 is an enlarged cross-sectional view of the part of the exposure mask according to a preferred embodiment of the present invention.

In the practice of the present process, it is important to determine a height of the projections of the exposure mask, because it can affect particulars of the resulting diffraction gratings and phase-shifts. The determination of the projection height or step length will be described herein with reference to FIG. 5 in which t is a height of the projection or length of step 14 and l is a width of the projection or a size (cavity length) of the desired DFB laser. As an exposure mask 11, glass material is used because it can transmit an ultraviolet radiation, i.e., He-Cd laser beam having a wavelength $\lambda$ of 3250 Å, as an exposure source. The glass material used has a refractive index of 1.5. Each of incident angles $\theta_L$ and $\theta_R$ is 54.3° and an inclination angle $\phi$ is 5° (see FIG. 4). From these parameters and the following equation:

$$2 \Lambda \sin\theta \cos\phi = \lambda$$

a period or pitch $\Lambda$ of the diffraction gratings is calculated to be 2003 Å. Accordingly, it is apparent that, when the glass material (n=1.5) is used as the mask 11, the height t of the projection of 2.03 μm is effective to reverse a phase of the gratings at positions of both steps 14.

A typical example of the glass materials useful as the exposure mask is a quartz, because it indicates less absorption of the ultraviolet radiation. Further, it is contemplated to apply an antireflection layer or coating or, briefly, so-called "AR coat" to both of the surfaces of glass or other masks. The AR coat is effective to prevent a formation of the disordered gratings due to multiple reflection or scattering of the radiations within the mask.

Spatial phase modulating masks of the present invention may take various forms and structures such as those of FIGS. 6 to 10, for example.

Figure 6:
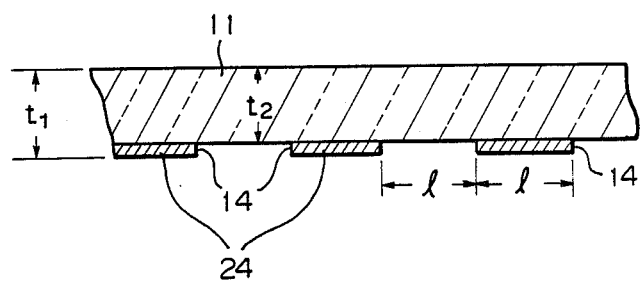
FIGS. 6 to 10 are cross-sectional views of the exposure mask according to a preferred embodiment of the present invention.

An exposure mask according to a preferred embodiment of the present invention is illustrated in FIG. 6. The illustrated mask is in the form of plate 11 which consists of a material transparent to the exposure radiations such as quartz glass, the plate 11 having selectively formed on a major surface thereof rectangular parallelopiped-shaped projections 24 which also consist of a material transparent to the exposure radiations such as silicon dioxide ($SiO_2$). The $SiO_2$ projections 24 each has a width l and a thickness $t_1-t_2$ (i.e., length of the step 14). These projections can be deposited on a surface of the plate 11 by any conventional manner such as vacuum deposition, spraying, sputtering or other techniques.

Figure 7:
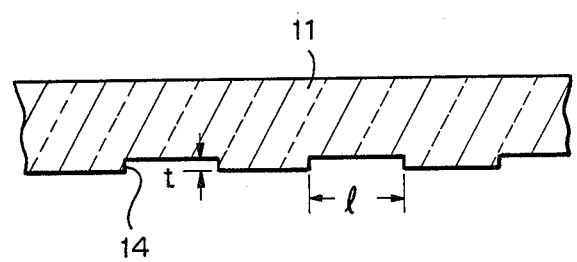

Another preferred exposure mask according to the present invention is shown in FIG. 7. In contrast to the mask of FIG. 6, the mask has etched recesses having a depth t. Selective etching of the transparent plate 11 is carried out to form steps 14.

Figure 8:
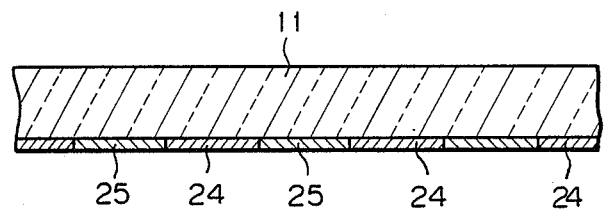

Still another preferred exposure mask according to the present invention is shown in FIG. 8. The mask has no step as in those of FIGS. 6 and 7, but results in similar effects. This is because, as is illustrated, the mask comprises a transparent plate 11 such as quartz glass having two transparent layers 24 and 25 alternately coated, without gap, on a surface thereof, which have different refractive indexes, for example, $SiO_2$ and $ZrO_2$ layers. The mask is in the form of a transparent plate having an uniform thickness, but has two different optical paths because of two different layers alternately formed on its surface.

Figure 16A:
FIGS. 16A to 16C are cross-sectional views illustrating, in sequence, an example of the production process of the exposure masks according to another preferred embodiment of the present invention.
Figure 16B:
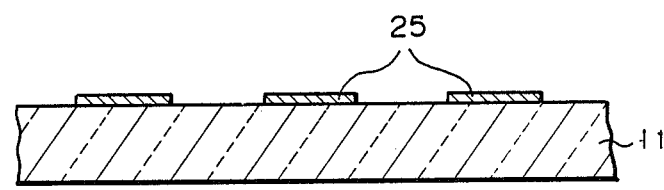
Figure 16C:
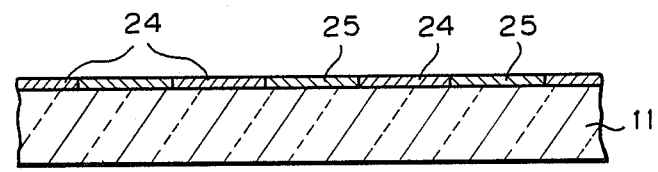

The exposure mask of FIG. 8 can be produced in the manner illustrated, in sequence, in FIGS. 16A, 16B and 16C, for example: A plate 11 of quartz glass is provided (FIG. 16A). Then, as is illustrated in FIG. 16B, a layer 25 which is transparent, but has a refractive index different from that of the plate 11, for example, $ZrO_2$ layer, is coated on a surface of the plate 11. Thereafter, as in FIG. 16C, each of the spaces between the two adjacent layers 25 is deposited with a material 24 which is transparent and has a refractive index identical with that of the plate 11, for example, $SiO_2$. The layers 24 and 25 are leveled.

Figure 9:
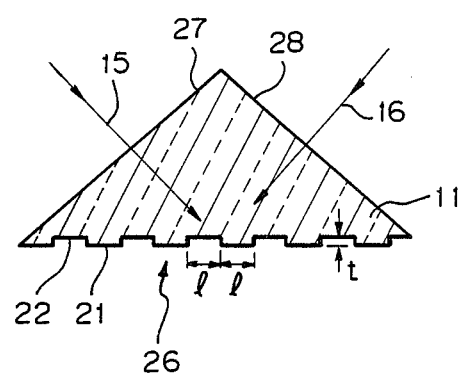

FIG. 9 illustrates a specific form of the exposure mask according to the present invention. The illustrated mask 11 is in the form of a triangular prism defined by three surfaces 26, 27 and 28. The surface 26 of the mask has alternately fabricated projections 21 and recesses 22. For this mask, undesirable reflection of the incident radiations 15 and 16 on the surfaces 27 and 28 can be effectively prevented because the radiations 15 and 16 are perpendicularly guided to the surfaces 27 and 28, respectively.

Figure 10:
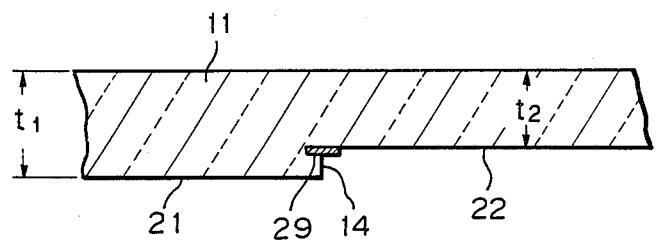

As a modification of the above-discussed exposure masks, according to the present invention, there is provided a light-screening layer-containing exposure mask illustrated in FIG. 10, for example. A lightscreening layer 29, preferably metal layer, for stopping a progress of the exposure radiations is disposed in a position of the step 14 or its neighborhood of the mask 11. The light-screening layer 29 may be entirely or partially embedded into the mask 11.

Figure 11:
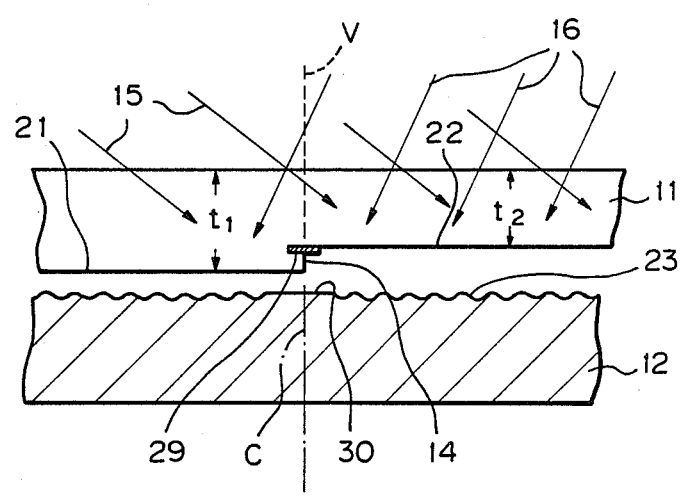
FIG. 11 is a cross-sectional view illustrating a basic principle of the process for the formation of the diffraction gratings using the exposure mask of FIG. 10.

A function of the light-screening layer 29 in the mask 11 will be easily understood from FIG. 11 which corresponds to FIG. 3B except for the light-screening layer 29 and the thus formed non-corrugation area 30. When the exposure radiations 15 and 16 are irradiated through the mask 11 on the substrate 12, they are partially stopped by the light-screening layer 29, and therefore they are not irradiated on a area 30 of the substrate 12 (The area 30 is in line with an area of the light-screening layer 29). Thus, the illustrated non-corrugation area 30 is formed. The use of such light-screening layer is effective to inhibit an adverse influence of the light scattering in the step area of the mask on the underlying substrate surface, and therefore to prevent a formation of the disordered interference fringes. In addition, these notable effects can be attained even though the step portion of the mask is unsatisfactory due to its production process. An improved efficiency of the laser oscillation can be constantly maintained.

Conventional etching or similar methods are not appropriate in the production of the exposure masks, discussed above, according to the present invention. The reasons why the conventional methods are not useful in the practice of the present invention will be described hereinafter with reference to FIG. 12 and FIGS. 13A and 13B.

Figure 12:
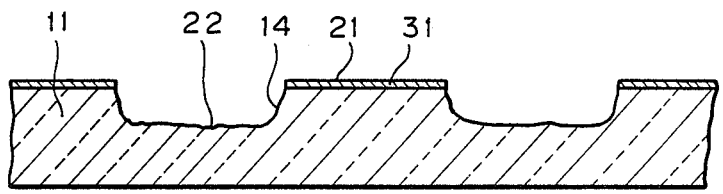
FIG. 12 is a cross-sectional view illustrating an example of the process for the production of the exposure masks using a conventional etching process.

FIG. 12 illustrates an example of the process for the production of the exposure masks using a conventional etching process. A projections-forming section 21 of the transparent plate 11 is covered with a mask 31, and the exposed areas of the plate 11 is etched off through a chemical or dry etching to form recesses 21. The mask 31 is removed after the formation of the recesses 21. However, undesirably, the resulting step 14 is not sharp, but forms a gentle slope. The sloped step 14 tends to cause an irregular reflection or scattering of the incident radiations, thereby not ensuring a formation of the desired interference fringes.

Figure 13A:
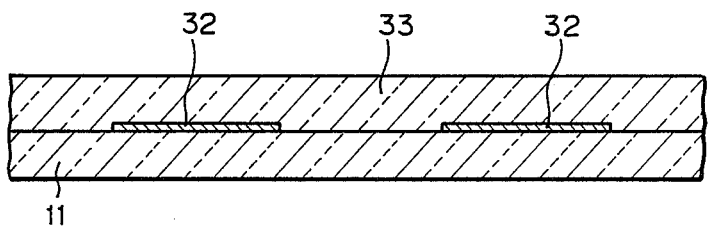
FIGS. 13A and 13B are cross-sectional views illustrating, in sequence, an example of the process for the production of the exposure masks using a conventional lift-off process.
Figure 13B:
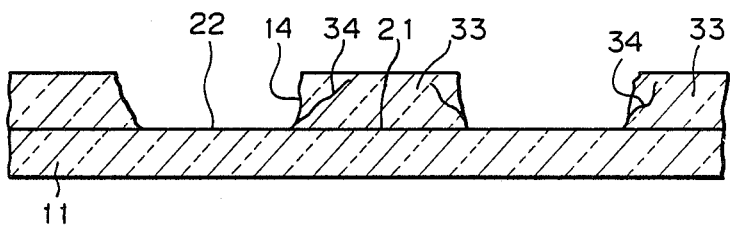

In place of the etching process discussed above with reference to FIG. 12, a conventional lift-off process may be used in the production of the exposure masks, although it suffers from problems concerning the step portion. For this process, an exposure mask is produced by forming a mask 32 on a predetermined area (recesses-forming area) of the transparent plate 11 by using a conventional manner. The resulting mask 32 and the exposed surface of the plate 11 is then covered with a layer 33 of the material which is identical with or similar to that of the plate 11 (FIG. 13A). A formation of the layer 33 is preferably carried out using a conventional manner such as deposition. The sandwiched mask 32 is then removed with any suitable solvent to similtaneously remove the overlying material. As a result, the exposure mask having alternately formed thereon projections 21 and recesses 22 is produced (FIG. 13B).

The above exposure mask produced using the lift-off process has recesses 22 with a bottom surface having a high surface accuracy. However, such a high accuracy is attainable in view of the conditions of the lift-off process only when the projected layer 33 has a thickness of about 0.2 μm, while a thickness of the layer 33 of the present exposure mask must be generally in a order of 2 to 3 μm. In fact, if the lift-off process is applied to selectively remove the layer 33 of the present exposure mask, it is difficult to completely remove the layer 33 in the selected areas, even if the mask 32 can be removed. Further, it is apparent from FIG. 13B that unacceptable cracks 34 are formed in the step 14 or other portions of the resulting exposure mask. Due to these defects, the exposure mask according to the lift-off process can adversely affect the optical characteristics of the diffraction gratings of the DFB laser. It is, therefore, desirable to prevent defects of the steps or other portions caused during the preparation of the exposure mask.

We now found satisfactory exposure masks for use in the formation of the phase-shifted diffraction gratings can be produced in accordance with a novel production process of the present invention.

Figure 14A:
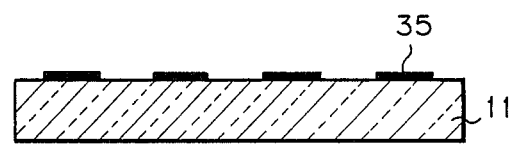
FIGS. 14A to 14E are cross-sectional views illustrating, in sequence, a basic principle of the process for the production of the exposure masks according to a preferred embodiment of the present invention.
Figure 14B:
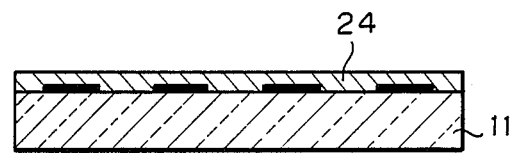
Figure 14C:
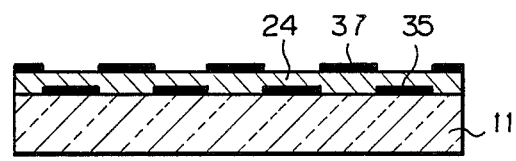
Figure 14D:
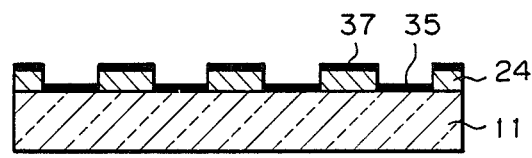
Figure 14E:
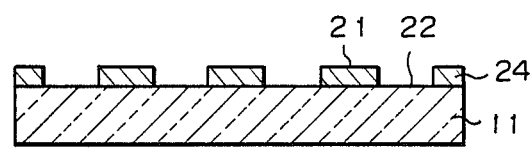

A basic principle of the production process for the exposure masks according to a preferred embodiment of the present invention is illustrated, in sequence, in FIGS. 14A to 14E. The production of the exposure mask of FIG. 14E is stated from FIG. 14A in which a substrate 11 for the exposure mask has a first mask 35 positioned in conformity with the recesses 22 of FIG. 14E. After the formation of the first mask 35, a layer 24 is coated over an upper surface of the substrate 11 as in FIG. 14B. Thereafter, as in FIG. 14C, a second mask 37 is coated over the selected areas of the layer 24 which correspond to the projection areas 21 of FIG. 14E. After the second mask 37 was coated, the layer 24 lying over the first mask 35 is selectively etched off. The result is illustrated in FIG. 14D. Finally, the first and second masks 35 and 37 are removed to obtain the exposure mask of FIG. 14E. A combination of these processing steps is effective to obtain the exposure masks having an improved surface accracy.

More particularly, the production process illustrated in principle in FIGS. 14A to 14E can be preferably carried out as illustrated in FIGS. 15A to 15F, for example.

Figure 15A:
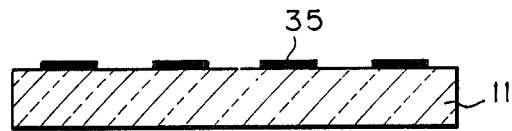
FIGS. 15A to 15F are cross-sectional views illustrating, in sequence, an example of the production process of the exposure masks according to a preferred embodiment of the present invention.

First, as in FIG. 15A, an upper surface of 1 mm-thick quartz plate 11 having optically polished surfaces as a substrate for the exposure mask is deposited with stripe-shaped aluminum (Al) layer 35 as a first mask. The deposition of the aluminum layer 35 is preferably attained using a conventional lift-off process. The aluminum layer 35 has a thickness of 700 Å, a width of 300 μm and an interval of 300 μm (period of 600 μm).

Figure 15B:
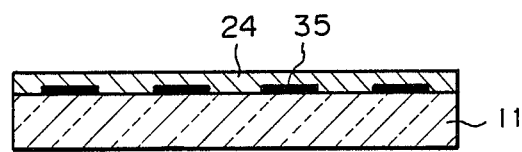

Second, as in FIG. 15B, a $SiO_2$ layer 24 of 2.14 μm is laminated over the quartz plate 11 by using a sputtering technique. The sputtering may be replaced with other lamination techniques such as deposition.

Figure 15C:
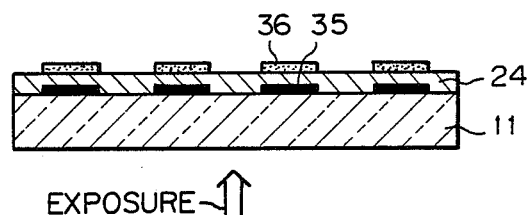

After a formation of the $SiO_2$ layer 24 has been completed, a photoresist is coated over the $SiO_2$ layer 24. A layer of the photoresist, as is shown in FIG. 15C, is exposed to a pattern of the exposure radiations from a back side of the plate and then only an exposed portion of the photoresist layer is selectively removed to produce a pattern of the photoresist 36 which is in line with a pattern of the first aluminum mask 35. Patterning of the photoresist is carred out using a conventional self-alignment process.

Figure 15D:
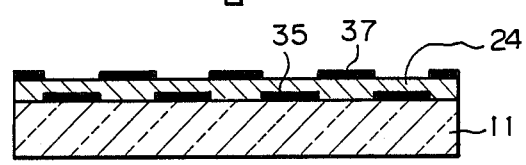

Following the self-alignment step, in order to form a second mask, an aluminum layer of 1200 Å thickness is deposited over a whole surface of the plate 11 and is selectively removed with a conventional lift-off process using the previously deposited pattern of the photoresist 36. As is shown in FIG. 15D, a second aluminum mask 37 which pattern corresponds to the areas other than the first aluminum mask 35 remains.

Figure 15E:
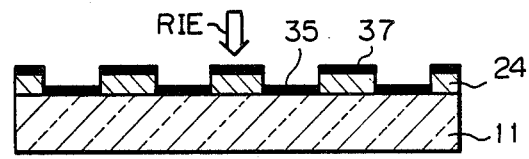
Figure 15F:
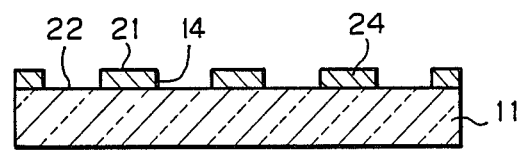

Thereafter, a reactive ion etching or so-called "RIE" is carried out in an atmosphere of carbon tetrafluoride ($CF_4$) containing 5% oxygen ($O_2$) to remove the non-masked $SiO_2$ layer 24, until the underlying first mask 35 is just exposed (see FIG. 15E). A $SiO_2$ layer 24 below the second mask 37 and the quartz plate 11 are not etched off, because they are protected by the masks 37 and 35, respectively.

Finally, the remaining masks 35 and 37 are removed with chemical etching, for example. An exposure mask comprising the quartz plate 11 with $SiO_2$ projections 24 is produced (see FIG. 15F). It has optical surfaces with a high surface accuracy, because, as described just above, its projections 21 and recesses 22 were protected with masks 37 and 35. In addition, its step 14 is sharp and perpendicular because of the use of RIE in the etching step of FIG. 15E.

The thus produced quartz mask can be effectively used as a transparent mask in the production of the phase-shifted diffraction gratings without suffering from reflection and scattering of radiations.

In the example described above with reference to FIGS. 15A to 15F, a self-alignment process was utilized to form a pattern of the photoresist 36 for use in the production of the second mask 37, although, of course, any conventional method may be used in the production of the second mask 37. Further, while the present method was explained, in the above example, about the formation of the projections and recesses in the exposure mask for use in the production of the DFB lasers as a particular example, it may be used in may other applications for the purose of the formation of the projections and recesses. For example, the present method can be effectively used to attain an epitaxial growth with a high accuracy at a bottom surface of the recesses 22 (see FIG. 15F).

According to another preferred embodiment of the present invention, the exposure mask of FIG. 10, for example, can be produced in accordance with the manner schematically shown, in sequence, in FIGS. 17A to 17G.

Figure 17A:
FIGS. 17A to 17G are cross-sectional views illustrating, in sequence, an example of the production process of the exposure masks according to a still another preferred embodiment of the present invention.
Figure 17B:
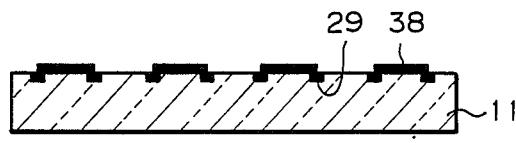
Figure 17C:
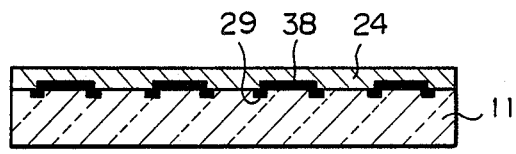
Figure 17D:
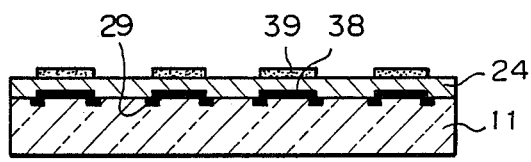
Figure 17E:
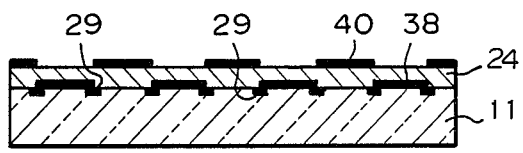

As a first step of the production process, a 1 mm-thick quartz plate 11 having optically polished surfaces is prepared. The plate 11, as illustrated in FIG. 17A, contains a previously embedded light-screening layer 29 at a position of each of the steps 14 of FIG. 17G which will be described hereinafter. In this instance, the light-screening layer 29 is completely embedded in the plate 11, while it may be partially projected from or coated on a surface of the plate 11. The plate 11 is used as a substrate for the exposure mask.

The subsequent processing steps illustrated in FIGS. 17B to 17G are substantially the same as those of FIGS. 15A to 15F discussed above except for the proviso that, in the former steps, the quartz plate 11 contains light-screening layers 29 and each of the first mask, the resist patten which position corresponds to that of the first mask and the second mask has new reference numerals "38", "39" and "40", respectively. So, these steps will be briefly described:

FIG. 17B

A first aluminum (Al) mask 38 is deposited over the quartz plate 11.

FIG. 17C

A layer of silicon dioxide (SiO₂) 24 is sputtered at a layer thickness of 2.14 μm.

FIG. 17D

A pattern of the photoresist 39 for use in the formation of a second mask in the next step is formed on the SiO₂ layer 24.

FIG. 17E

A second aluminum (Al) mask 40 is formed using the photoresist pattern 39 and in accordance with a conventional lift-off process.

FIG. 17F

A non-masked SiO₂ layer 24 is selectively etched in the presence of the first and second Al masks 38 and 40 in accordance with a conventional RIE process.

FIG. 17G

The remaining masks 38 and 40 are chemically etched. The illustrated exposure mask having embedded therein the light-screening layers 29 is produced.

Figure 17F:
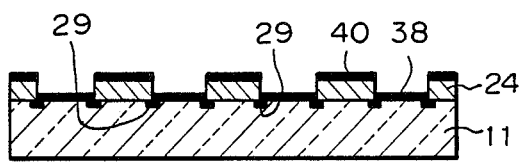
Figure 17G:
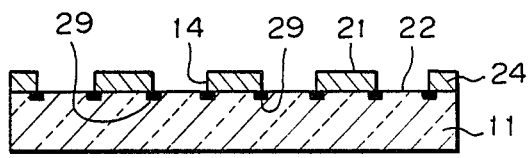

The material used as a light-screening layer in the present invention is preferably a material capable of resisting to a chemical etching in the step of FIG. 17G. A width of the stripe-shaped light-screening layer can be widely varied, but, if it is desired to produce an exposure mask for the phase-shifted interference fringes having a pitch of 300 μm and a thickness of 2 μm, the use of the light-screening layer having a width of 2 to 3 μm is the most effective.

The exposure mask produced after the above processing steps has optical surfaces with a high surface accuracy, since its projections 21 and recesses 22 were protected by the masks 38 and 40 during the etching step of FIG. 17F. Using this exposure mask in the formation of the phase-shifted diffraction gratings, scattering of the incident radiations 15 and 16 at the step 14 of this mask can be effectively prevented and, in addition, excellent gratings 23 with a high accuracy can be produced because of the presence of the non-corrugation area 30 (see FIG. 11).

Additionally speaking, a light-screening layer can be applied to a step portion of the exposure mask at any suitable stage of the production, although, in the above example, it has been already embedded in the quartz plate. For example, if the exposure mask is produced in the manner illustrated in FIGS. 15A to 15E, a light-screening layer can be applied to the step 14 of the mask after the formation of the projections 21 and recesses 22.

Details of the exposure in the process for the phase-shifted diffraction gratings according to the present invention were illlustrated in and described hereinbefore with reference to FIGS. 3A and 3B. Referring to FIG. 3A again, two fluxes of eposure radiations 15 and 16 are irradiated through the mask 11 on the substrate 12 having the photoresist layer 13 at an incident angle $\theta_L$ and $\theta_R$, respectively. The incident radiations 15 and 16 interfer in the photoresist layer 13 to form phase-shifted interference fringes. The interference fringes are then transferred to the underlying substrate 12 to form phase-shifted diffraction gratings or corrugations therein.

In such a case and when the laser to be fabricated is a long wevelength-type DFB semiconductor laser in which the substrate consists of InP and its active layer is made from InGaAsP, a period or pitch Λ of the gratings of the resulting semiconductor laser is 1,995 Å assuming that an effective refractive index n of the active laser is 3,283 and a Bragg wavelength $\lambda_0$ is 1.31 μm. The grating pitch ζ of 1,995 Å is attained if He-Cd laser beams with a wavelength of 3,250 Å as the exposure radiations 15 and 16 are irradiated on a surface of the exposure mask 11 at an incident angle of $\theta_L = \theta_R = 54.5°$. Further, these radiations are unsymmetrically irradiated with respect to the normal line V of the mask 11, because their central axis A is inclined by the angle φ from the normal line V. Therefore, when the inclination angle φ is 5°, an incident angle of the radiation 15 is $\theta_L$ plus φ, i.e., 59.5° and that of the radiation 16 is $\theta_R$ minus φ, i.e., 49.5°.

The exposure of the photoresist layer 13 through the mask 11 to the radiations 15 and 16 should be ideally conducted without repeated reflections, namely, so-called "multiple reflections" between the mask 11 and the photoresist 13. However, it is the case that such multiple reflections are essentially caused during the pattern-wise exposure of the photoresist layer. A reflection of the radiation at both surfaces of the mask 11 can be prevented or reduced to a negligible level if one or both surfaces of the mask 11 is coated with an anti-reflection layer (not shown), but a relection of the radiation at an exposed surface of the photoresist layer 13 cannot be prevented nor reduced because an application of such an anti-reflection layer to the layer surface is not allowed due to technical reasons and particularly adverse effects of the anti-reflection layer to the exposure results. Multiple reflections cause an unevenness and disorder in the pattern of the resulting interference fringes and finally undersired gratings in the fabricated semiconductor laser. It is, therefore, desirable to control a reflection of the radiation at the surface of the substrate to a level which does not hinder a laser oscillation in the production of the gratings of the laser, in other words, a reflectivity of about 5% or less.

Figure 18:
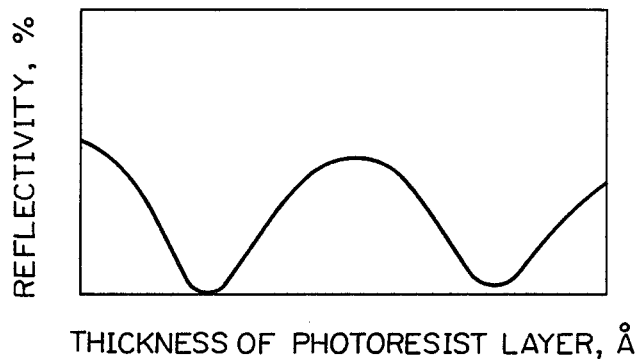
FIG. 18 is a graph showing a basic principle of the relationship between the layer thickness of the photoresist and its reflectivity.
Figure 19:
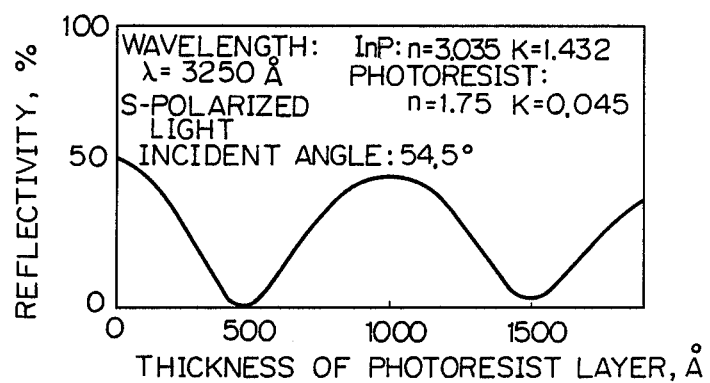
FIG. 19 is a graph showing an example of the relationship between the layer thickness of the photoresist and its reflectivity.
Figure 20:
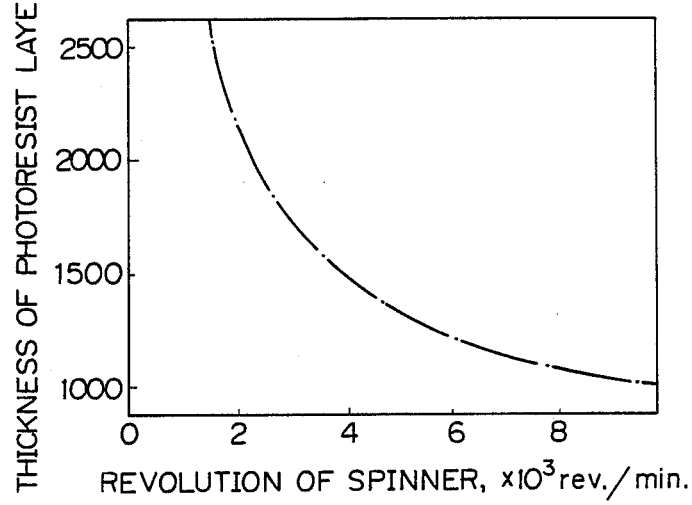
FIG. 20 is a graph showing the relationship between the revolution number of the spinner and the layer thickness of the photoresist.
Figure 21:
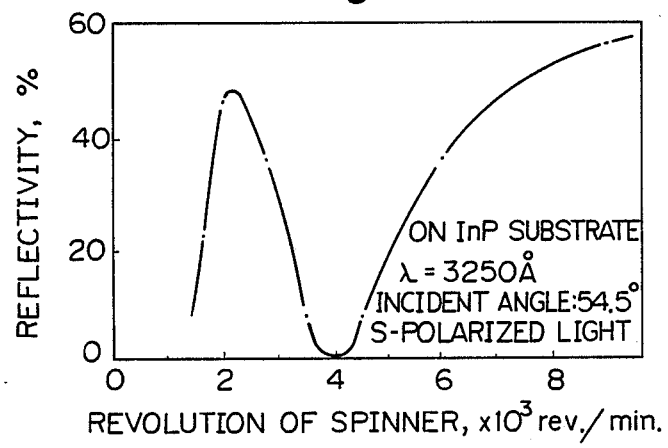
FIG. 21 is a graph showing the relationship between the revolution number of the spinner and the reflectivity of the photoresist.
Figure 22:
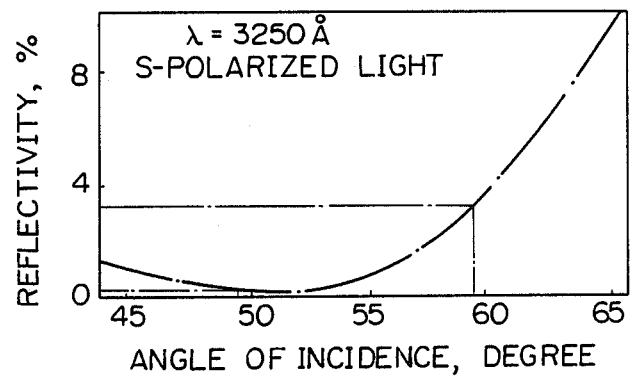
FIG. 22 is a graph showing the relationship between the incident angle of the exposure radiation and the reflectivity of the photoresist.

In order to reduce undesirable reflections at a surface of the substrate, we studied an improvement of the exposure process and found a new exposure process, a basic principle of which is shown in a graph of FIG. 18. The graph was prepared by irradiating S-polarized lights at an incident angle of 54.5° onto a photoresist layer-coated InP substrate, determining a reflectivity of the radiation as a function of the layer thickness of the photoresist layer, and plotting the results.

The graph of FIG. 18 indicates that the reflectivity of the radiation at the surface of the substrate varies depending upon the thickness of the photoresist layer. This teaches that, according to the present invention, multiple reflections of the exposure radiation can be effectively inhibited by adjusting a thickness of the photoresist layer to one which results in a reduced reflectivity of the radiation at the substrate surface. Namely, in this invention, a thickness of the photoresist layer on the substrate is selected depending on a wavelength of the exposure radiation, the type of polarized lights, an incident angle of the lights, and a refractive index of the substrate, so that it obtains the lowest reflectivity of the radiation at the surface of the substrate.

The new exposure process according to the present invention will be more appreciated from the following descriptions and related FIGS. 19 to 22.

It is a premise in the practice of the exposure process of the present invention that it is essential for a surface of the substrate, particularly an InP substrate, having a photoresist layer coated thereon, to exhibit a reflectivity of 5% or less. Thus, in order to ascertain whether or not such a reflectivity can be practically attained, a complex index of refraction of the radiation in the photoresist:AZ-1350J (above described) coated on the quartz substrate was first calculated from measurements of the transmittance and reflectivity. It was found that the refractive indexes of the radiations (wavelength 3250 Å) in the photoresist:AZ-1350J were 1.75 (real part) and 0.045 (imaginary part). In addition, the refractive indexes of the same radiation in the InP substrate were confirmed from the literature to be 3.035 (real part) and 1.432 (imaginary part). Using these parameters, a reflectivity of the InP substrate to which a S-polarized light was irradiated at an incident angle of 54.5° was calculated as a function of the layer thickness of the photoresist. The results are plotted in FIG. 19, which indicates that a minimum reflectivity is obtained at the layer thicknesses of about 450 Å and about 1,500 Å. The layer thickness of about 450 Å is not appropriate, since such a thin layer has technical and other problems. It is, therefore, more preferable to use a layer thickness of the photoresist of about 1,500 Å in the practice of the present invention.

Further, in the cases that the photoresist is spin-coated onto the substrate, we found that a layer thickness of the photoresist is controllable with the control of the revolution of the spinner used. This fact is apparent from FIG. 20, which was plotted using experimental results obtained in the spin-coating of the photoresist:AJ-1350J on the InP substrate. The graph of FIG. 20 indicates that the photoresist layer having a thickness of 1,500 Å is obtained at a spinner revolution of about 4,000 rev./min. Similarly, a reflectivity of the radiation at the surface of the substrate is controllable with the control of the revolutions of the spinner. A graph of FIG. 21 was plotted using the experimental results, and indicates that a minimum reflectivity is obtained at the revolutions of the spinner of about 1,500 rev./min. and about 4,000 rev/min. Therefore, it can be concluded that a minimum reflectivity is attained if the photoresist is spin-coated at about 4,000 rev./min. to obtain a layer thickness of about 1,500 Å.

Next, a dependency of the reflectivity of the substrate on an incident angle of the radiation was determined. This was made by measuring the reflectivity of the photoresist:AZ-1350J-coated InP substrate at different incident angles of S-polarized light having a wavelength of 3,250 Å. A layer thickness of the photoresist was 1,500 Å. The results are summarized in FIG. 22. The graph of FIG. 22 indicates that, when the radiations 15 and 16 are irradiated at the incident angles of 59.5° and 49.5°, respectively, as discussed above with reference to FIG. 3A, satisfactory results, namely, a reflectivity of 5% or less are obtained, thereby enabling the prevention of multiple reflections of the radiation between the mask and the substrate.

In addition, in order to attain an effective interference of fields of two fluxes of incident radiation, it is preferable to use an S-polarized light or component as the incident radiation, because the photoresist layer coated on the substrate is exposed to an oscillation field of the radiation. The S-polarized light is preferably introduced into the photoresist layer at an incident angle of 30° to 70°.

Moreover, in order to attain an effective inhibition of the reflection at the surface of the substrate, it is preferable to use the substrate having a refractive index of 2.5 to 3.5, preferably about 3.0 (InP=3.035). This is because the reflectivity at the surface of the substrate is also affected by the refractive index of the substrate.

As a specific modification of the phase-shifted diffraction gratings of the present invention, according to the present invention, there are also provided an exposure mask, its production process, and its use in the formation of further phase-shifted diffraction gratings. These inventions will be described hereinafter with reference to FIGS. 23 to 25.

Figure 23:
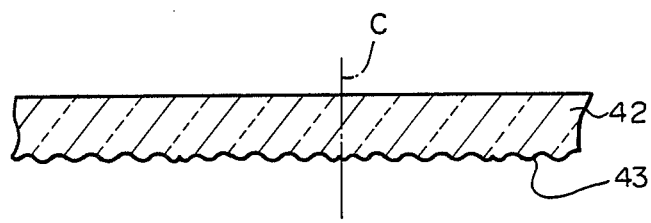
FIG. 23 is a cross-sectional view of the exposure mask according to another preferred embodiment of the present invention.

FIG. 23 is a cross-sectional view of the exposure mask according to another preferred embodiment of the present invention. As is illustrated, the exposure mask is in the form of a transparent plate 42, a major surface of which has phase-shifted diffraction gratings 43 formed thereon. A phase-shift of the gratings 43 is positioned in line with the oscillation center C (other lines of the oscillation centers were omitted from this drawing for simplicity). The gratings have phase-shifts each of which is preferably shifted by an amount of a half of their period. Further, preferably, a diffraction grating-fabricated surface 43 of the plate 42 and another surface opposed thereto have an antireflection layer (not shown) coated on each of the surfaces.

The above exposure masks of the present invention can be produced in accordance with the manner similar to those described above with reference to FIGS. 3A and 3B, FIG. 4 and FIG. 11, for example. Therefore, according to the present invention, the phase-shifted gratings-containing exposure masks can be easily mass produced by repeatedly using the first produced exposure mask having the same structure. Further, if desired, the gratings may be fabricted on a surface of the exposure mask with an electron beam lithography.

The thus produced phase-shifted gratings-containing masks according to the present invention can be effectively used in the formation of the phase-shifted diffraction gratings of the DFB lasers or similar devices. In fact, using such masks, it is possible to use a simpler and smaller optical exposure system in the production of the phase-shifted diffraction gratings in comparison with the conventional exposure systems. The optical exposure systems used in the present process have a resistance to vibration and is very easily usable due to their simple structure.

Figure 24:
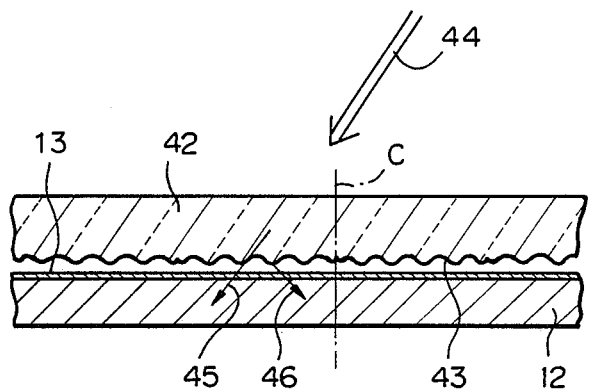
FIG. 24 is a cross-sectional view illustrating a basic principle of the process for the formation of the diffraction gratings using the exposure mask of FIG. 23.

FIG. 24 is a cross-sectional view illustrating a basic principle of the process for the formation of the diffraction gratings using the exposure mask of FIG. 23. A substrate 12 having a surface for the diffraction gratings to be fabricated has a layer 13 of the photoresist. A gratings-fabricated surface 43 of the exposure mask 42 is opposed to the photoresist layer 13 of the substrate 12. The gratings of the mask 42, as is illustrated, have periodically disposed phase-shifting points each of which is in line with the oscillation center C. Unidirectional incident lights as the exposure radiations are identified by the reference numeral 44.

The incident lights 44, after passed through the mask 42, produce two different lights, i.e., transmitted lights 45 and diffracted lights 46, which have the same emission angle and intensity. The transmitted lights 45 correspond to the radiations 16 and the diffracted lights 46 to the radiations 15 (see FIG. 4A and 3B, for example).

The bidirectional lights 45 and 46 are then irradiated onto the photoresist layer 13 in which a pattern of the interference fringes (not shown) is thus formed. The pattern of the interference fringes is then transferred to the underlying substrate 12 to fabricate diffraction gratings (not shown) on its surface. The resulting phase-shifted diffraction gratings correspond to those of the mask 42 and, of course, phase-shifting points of the former to those of the latter.

Figure 25:
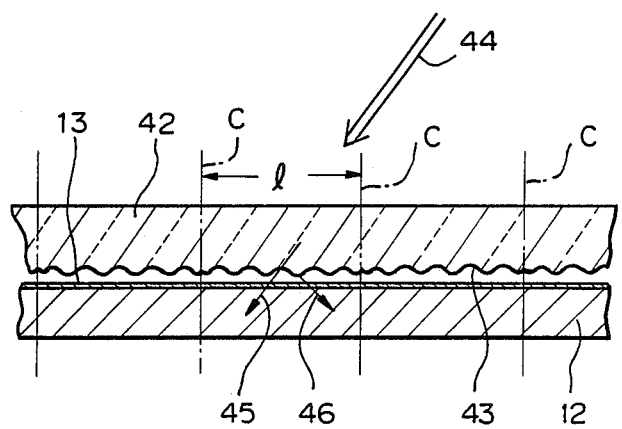
FIG. 25 is a cross-sectional view illustrating an example of the process for the formation of the diffraction gratings using the exposure mask of FIG. 23.

The above-described gratings formation process of the present invention will be more appreciated from FIG. 25 which illustrates an example of the present process.

A gratings-fabricated surface 43 of the mask 42 is placed in contact with a photoresist layer 13 of the InP substrate 12. S-polarized lights 44 as the exposure radiations are then irradiated, which are divided into the transmitted lights 45 and the primarily diffracted lights 46, each of which has the same intensity and emission angle. The lights 45 and 46 incident on the photoresist layer 13 form a pattern of the interference fringes (not shown) which is then transferred to a surface of the substrate 12 by using an etching or similar process to form diffraction gratings therein. In this transfer process, if the gratings of the mask 42 have a phase shift of a half pitch at each of the positions corresponding to the oscillation centers C, such phase shifts are also transfered to the surface of the substrate 12, thereby resulting in $\lambda/4$-shifted diffraction gratings. This is because a phase of the diffracted lights 46 was reversed, although that of the transmitted lights 45 was not changed.

We claim:

1. A spatial phase modulating mask for use in the formation of diffraction gratings using two-beam interference exposure, including: a material transparent to radiation used in an exposure step in the formation of diffraction gratings, said material comprising first and second portions providing two different optical paths being positioned adjacent an oscillation center, each portion being structured so that when two asymmetrical fluxes of radiation are irradiated at different angles to the oscillation center such that a bisection of said fluxes is inclined with respect to a normal of the mask, a phase-shifted pattern of interference fringes, that is phase-shifted about the oscillation center, exits the mask.

2. A mask as in claim 1 which is in the form of a plate having two or more rectangular paralleopiped-shaped recesses selectively formed on a major surface thereof.

3. A mask as in claim 2 in which a light-screening layer is disposed in each of the two edges of the bottom of the recesses.

4. A mask as in claim 3 in which the light-screening layer is a metal layer.

5. A mask as in claim 3 in which all or part of the light-screening layer is embedded in the mask.

6. A mask as in claim 2 in which a recesses-fabricated surface of the plate and another surface opposed thereto have an antireflection layer coated on each of the surfaces.

7. A mask as in claim 1 which is in the form of a plate having selectively formed on a major surface thereof two or more rectangular parallelopiped-shaped projections which consist of a material transparent to radiations used in an exposure step in the formation of diffraction gratings, each of the rectangular parallelopiped-shaped spaces between two adjacent projections being occupied with a material which is transparent to radiations used in an exposure step in the formation of diffraction gratings, but which has a refractive index different from that of the projections.

8. A mask as in claim 7 in which a light-screening layer is disposed in each of the two edge areas of the bottom of the projections.

9. A mask as in claim 8 in which the light-screening layer is a metal layer.

10. A mask as in claim 8 in which all or part of the light-screening layer is embedded in the mask.

11. A mask as in claim 7 in which a projections-fabricated surface of the plate and another surface opposed thereto have an antireflection layer coated on each of the surfaces.

12. A mask as in claim 1 which is in the form of a plate, a major surface of which has formed thereon phase-shifted diffraction gratings.

13. A mask as in claim 12 in which the diffraction gratings produce diffracted and transmitted lights having the same emission angle and intensity, after an incident exposure radiation was passed through the same.

14. A mask as in claim 12 in which the diffraction gratings have a phase shifted by an amount of a half of their period.

15. A mask as in claim 12 in which a diffraction gratings-fabricated surface of the plate and another surface opposed thereto have an antireflection layer coated on each of the surfaces.

16. A mask as in claim 1 which is in the form of a triangular prism having selectively formed on a major surface thereof two or more rectangular parallelopiped-shaped recesses.

17. A mask as in claim 16 in which all of the three major surfaces of the prism have an antireflection layer coated on each of the surfaces.

18. A mask as in claim 1, wherein said material has a flat surface, and an opposing surface having at least one step formed therein.

19. A process for the production of a spatial phase modulating mask comprising a substrate having two or more projections and recesses alternately formed on a surface thereof, which process comprises the steps of:
forming on a surface of the substrate a first masking layer having a pattern which corresponds to a pattern of the recesses to be formed on the substrate;
coating the first masking layer and the uncoated surface of the substrate with a projections-forming material;
forming on the coating of the projections-forming material a second masking layer having a pattern which corresponds to a pattern of the projections to be formed on the substrate;
etching off the unmasked coating of the projections-forming material until the underlying first masking layer is just exposed; and
removing the first and second masking layers.

20. A process as in claim 19 in which each of the substrate and the coating of the projections-forming material is transparent, and in which, in the formation of the second masking layer, a photoresist pattern which corresponds to a pattern of the recesses to be formed on the substrate is formed on the coating of the projections-forming material using a self-alignment method wherein a patterning exposure is carried out from the back side of the transparent substrate through the same and the transparent coating of the projections-forming material.

21. A process as in claim 19 in which the substrate and the projections-forming material are silicon dioxide.

22. A process as in claim 19 in which silicon dioxide is used as the projections-forming material and in which the unmasked coating of the projections-forming silicon dioxide coating is etched with an ion beam etching in a mixed gas of $CF_4$ and $O_2$, while the first and second masking layers are aluminum.

23. A process as in claim 19 which comprises the further step of filling the recesses with a material having a refractive index different from that of the projections-forming material.

24. A process as in claim 19 which comprises the further step of coating both surfaces of the substrate containing the projections and recesses with an antireflection layer.

25. A process as in any one of claims 19 to 24 in which the substrate has a light-screening layer disposed on its surface in an interfacial area between the two adjacent projection and recess to be formed.

* * * * *

UNITED STATES PATENT AND TRADEMARK OFFICE
CERTIFICATE OF CORRECTION

PATENT NO. : 4,806,442
DATED : February 21, 1989
INVENTOR(S) : Nasataka Shirasaki et al.

It is certified that error appears in the above-identified patent and that said Letters Patent is hereby corrected as shown below:

Col. 14, line 42, "ς" should be --∧--;

Col. 18, line 5, "center ," should be --center,--

Line 14, "paralleopiped" should be --parallelopiped--;

Line 17, "edges" should be --edge areas--.

Signed and Sealed this

Fifteenth Day of August, 1989

Attest:

DONALD J. QUIGG

Attesting Officer

Commissioner of Patents and Trademarks